US011297745B2

United States Patent
King et al.

(10) Patent No.: US 11,297,745 B2
(45) Date of Patent: Apr. 5, 2022

(54) ACTIVE THERMAL MANAGEMENT SYSTEM FOR ELECTRONIC DEVICES AND METHOD OF ACHIEVING DEVICE-TO-DEVICE ISOTHERMALIZATION

(71) Applicant: The Board of Trustees of the University of Illinois, Urbana, IL (US)

(72) Inventors: William P. King, Champaign, IL (US); Nenad Miljkovic, Urbana, IL (US); Patricia B Weisensee, St. Louis, MO (US); Beomjin Kwon, Chandler, AZ (US); Tianyu Yang, Urbana, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 119 days.

(21) Appl. No.: 16/359,585

(22) Filed: Mar. 20, 2019

(65) Prior Publication Data

US 2019/0307025 A1 Oct. 3, 2019

Related U.S. Application Data

(60) Provisional application No. 62/649,134, filed on Mar. 28, 2018.

(51) Int. Cl.
*H05K 7/20* (2006.01)
*H01L 23/473* (2006.01)
*H01L 23/367* (2006.01)

(52) U.S. Cl.
CPC ....... *H05K 7/20945* (2013.01); *H01L 23/367* (2013.01); *H01L 23/473* (2013.01);
(Continued)

(58) Field of Classification Search
CPC ........ F28F 3/12; F28F 9/26; F28F 7/02; F28F 21/065; F28F 3/086; H05K 1/0204;
(Continued)

(56) References Cited

U.S. PATENT DOCUMENTS 7,411,792 B2     8/2008   Richards et al.
8,082,978 B2 †   12/2011   Fedorov
(Continued)

OTHER PUBLICATIONS

Joseph P Valentino, Thermocapillary actuation of liquids using patterned microheater arrays (Year: 2004).*

(Continued)

*Primary Examiner* — Michael A Matey
(74) *Attorney, Agent, or Firm* — Crowell & Moring LLP

(57) ABSTRACT

An active thermal management system for electronic devices comprises: a heat spreader having an internal channel; a thermally conductive body moveably positioned in the internal channel; and two or more electronic devices in thermal contact with a back surface of the heat spreader and positioned adjacent to the internal channel. A location of the thermally conductive body within the internal channel determines a path for heat flow from the back surface to a front surface of the heat spreader. The location of the thermally conductive body within the internal channel may be selected to minimize a temperature differential ($\Delta T$) between the electronic devices.

12 Claims, 6 Drawing Sheets

(52) U.S. Cl.
CPC ......... *H05K 7/209* (2013.01); *H05K 7/20254* (2013.01); *H05K 7/20509* (2013.01); *H05K 7/20927* (2013.01)

(58) Field of Classification Search
CPC .. H05K 1/0203; H05K 7/1432; H05K 7/2039; H05K 7/209; F28D 15/00; F28D 15/0233; F28D 2021/0028; F28D 21/00
See application file for complete search history.

(56) References Cited

U.S. PATENT DOCUMENTS

| | | | |
|---|---|---|---|
| 8,378,453 B2 † | 2/2013 | Fedorov | |
| 8,953,314 B1 * | 2/2015 | Fedorov | H01L 23/473 361/689 |
| 9,010,409 B2 | 4/2015 | De Bruyker et al. | |
| 2004/0022029 A1 * | 2/2004 | Nagatomo | H01L 23/3736 361/709 |
| 2007/0257766 A1 | 11/2007 | Richards et al. | |
| 2009/0213541 A1 * | 8/2009 | Butterbaugh | H01L 23/473 361/689 |
| 2010/0230079 A1 * | 9/2010 | Byers | F28D 15/0275 165/158 |
| 2010/0277868 A1 * | 11/2010 | Beaupre | H05K 7/20927 361/700 |
| 2011/0038122 A1 * | 2/2011 | Ahangar | H01L 23/4275 361/700 |
| 2011/0292613 A1 * | 12/2011 | Deng | H01L 23/3733 361/720 |
| 2013/0126003 A1 | 5/2013 | De Bruyker et al. | |
| 2015/0034367 A1 * | 2/2015 | Nagatomo | B23K 1/012 174/252 |
| 2015/0319880 A1 * | 11/2015 | Strickland | H05K 1/0209 361/711 |
| 2016/0085277 A1 * | 3/2016 | Samadiani | H05K 7/20336 361/679.53 |
| 2016/0234967 A1 * | 8/2016 | Choi | H05K 7/20927 |
| 2017/0241039 A1 | 8/2017 | Takai | |
| 2019/0139862 A1 * | 5/2019 | Chang | H01L 23/473 |
| 2019/0221501 A1 * | 7/2019 | Tamura | H01L 21/4882 |
| 2019/0335628 A1 * | 10/2019 | Lei | H05K 7/20872 |
| 2019/0355840 A1 * | 11/2019 | Mori | H01L 29/739 |
| 2020/0060023 A1 * | 2/2020 | Miyamoto | H05K 1/14 |
| 2020/0335416 A1 * | 10/2020 | Yamasaki | H01L 21/4882 |
| 2021/0045257 A1 * | 2/2021 | Wu | H01L 23/34 |

OTHER PUBLICATIONS

Andresen et al., "Study of reliability-efficency tradeoff of active thermal control for power electronic systems," *Microelectronics Reliability*, 58 (2016) pp. 119-125.

Brown, "Weights and Efficiencies of Electric Components of a Turboelectric Aircraft Propulsion System," *49th AIAA Aerospace Sciences Meeting including the New Horizons Forum and Aerospace Exposistion* (Jan. 4-7, 2011), Orlando, Florida, pp. 1-18.

Bulgrin et al., "An Investigation of a Tunable Magnetomechanical Thermal Switch," *Journal of Heat Transfer*, 133 (Oct. 2011) pp. 101401-1-7.

Cho et al., "Fabrication and characterization of a thermal switch," *Sensors and Actuators A*, 133 (2007) pp. 55-63.

Ciappa et al., "Reliability of High-Power IGBT Modules for Traction Applications," *IEEE 45th Annual International Reliability Physics Symposium Proceedings* (2007) pp. 480-485.

Foulkes et al., "Active Hot Spot Cooling of GaN Transistors With Electric Field Enhanced Jumping Droplet Condensation," *Conf. Proc.—IEEE Appl. Power Electron. Conf. Expo.—APEC* (2017) pp. 912-918.

Guo et al., "Thermal characterization of a new differential thermal expansion heat switch for space optical remote sensor." *Applied Thermal Engineering*, 113 (2017) pp. 1242-1249.

He, et al., "Thermal Design and Measurements of IGBT Power Modules: Transient and Steady State," *Conference Record of the 1999 IEEE Industry Applications Conference* (1999) pp. 1440-1444.

Hetsroni et al., "Nonuniform Temperature Distribution in Electronic Devices Cooled by Flow in Parallel Microchannels," *IEEE Transactions on Components and Packaging Technologies*, 24, 1 (Mar. 2001) pp. 16-23.

Jankowski et al., "Modeling Transient Thermal Response of Pulsed Power Electronic Packages," *PPC2009—17th IEEE Int. Pulsed Power Conf.* (2009) pp. 820-825.

Jansen et al., "Turboelectric Aircraft Drive Key Performance Parameters and Functional Requirements," *AIAA Propulsion and Energy Forum 51st AIAA/SAE/ASEE Joint Propulsion Conference* (Jul. 27-29, 2015), Orlando, FL, pp. 1-10.

Jia et al., "Solid-Liquid Hybrid Thermal Interfaces for Low-Contact Pressure Thermal Switching," *Journal of Heat Transfer*, 36 (Jul. 2014) pp. 074503-1-4.

Kassakian et al., "Evolving and Emerging Applications of Power Electronics in Systems," *IEEE Journal of Emerging and Selected Topics in Power Electronics*, 1,2 (Jun. 2013) pp. 47-58.

Kandasamy et al., "Transient cooling of electronics using phase change material (PCM)-based heat sinks," *Applied Thermal Engineering*, 28 (2008) pp. 1047-1057.

Khan et al., "Recapillarity: Electrochemically Controlled Capillary Withdrawal of a Liquid Metal Alloy from Microchannels," *Advanced Functional Materials*, 25 (2015), pp. 671-678.

Kolar et al., "PWM Converter Power Density Barriers," *IEEE Power Conversion Conference* (2007) pp. P9-P29.

Lei et al., "A 2-kW Single-Phase Seven-Level Flying Capacitor Multilevel Inverter With an Active Energy Buffer," *IEEE Transactions on Power Electronics*, 32, 11 (Nov. 2017) pp. 8570-8581.

Lemanski et al., "A Low Hysteresis NiTiFe Shape Memory Alloy Based Thermal Conduction Switch," *AIP Conference Proceedings* 824, 3 (2006) pp. 3-9.

McLanahan et al., "A dielectric liquid contact thermal switch with electrowetting actuation," *Journal of Micromechanics and Microengineering*, 21 (2011) pp. 104009-1-12.

Moore et al., "Emerging challenges and materials for thermal management of electronics," *Materials Today*, 17, 4 (May 2014) pp. 163-174.

Mudawar, "Assessment of High-Heat-Flux Thermal Management Schemes," *IEEE Transactions on Components and Packaging Technologies*, 24, 2, (Jun. 2001) pp. 122-141.

Murdock et al., "Active Thermal Control of Power Electronic Modules," *IEEE Transactions on Industry Applications*, 42, 2 (Mar./Apr. 2006) pp. 552-558.

Oh et al., "Jumping-droplet electronics hot-spot cooling," *Appl. Phys. Lett.* 110, (2017) pp. 123107-1-5.

Pallo et al., "Power-Dense Multilevel Inverter Module using Interleaved GaN-Based Phases for Electric Aircraft Propulsion," *Conf. Proc.—IEEE Appl. Power Electron. Conf. Expo.—APEC* (2018) pp. 1656-1661.

Puga et al., "Novel thermal switch based on magnetic nanofluids with remote activation," *Nano Energy*, 31 (2017) pp. 278-285.

Schutze et al., "Further Improvements in the Reliability of IGBT Modules," *Conference Record of 1998 IEEE Industry Applications Conference, Thirty-Third IAS Annual Meeting*, (1998) pp. 1022-1025.

Slater et al., "Thermomechanical characteristics of a thermal switch," *Sensors and Actuators A*, 53 (1996) pp. 423-427.

Tang et al., "Photochemically induced motion of liquid metal marbles," *Appl. Phys. Lett.* 103, (2013) p p. 174104-1-4.

Tilford et al., "Thermo-mechanical Modelling of Power Electronics Module Structures," *IEEE Proc. Electron. Packag. Technol. Conf. EPTC*, (2006) pp. 214-219.

Tsukamoto et al., "Long working range mercury droplet actuation," *Journal of Micromechanics and Microengineering*, 19 (2009) pp. 094016-1-9.

Walsh et al., "Embedded Microjets for Thermal Management of High Power-Density Electronic Devices," *IEEE Transactions on Components, Packaging and Manufacturing Technology*, 9, 2, (Feb. 2019) pp. 269-278.

(56) References Cited

OTHER PUBLICATIONS

Wang et al. "Electromagnetic rotation of a liquid metal sphere or pool within a solution," *Proc. R. Soc. A*, 471 (2015) pp. 20150177-1-12.

Wang et al., "A gas-atomized spray cooling system integrated with an ejector loop: Ejector modeling and thermal performance analysis," *Energy Conversion and Management*, 180 (2019) pp. 106-118.

Whitaker et al., High-Temperature SiC Power Module with Integrated SiC Gate Drivers for Future High-Density Power Electronics Applications, *2nd IEEE Workshop on Wide Bandgap Power Devices Appl. WiPDA 2014*, (2014) pp. 36-40.

Whitaker et al., "A High-Density, High-Efficiency, Isolated On-Board Vehicle Battery Charger Utilizing Silicon Carbide Power Devices," *IEEE Transactions on Power Electronics*, 29, 5 (May 2014) pp. 2606-2617.

Yang et al., "Millimeter-scale liquid metal droplet thermal Switch," *Appl. Phys. Lett.*, 112, (2018) pp. 063505-1-6.

Yang et al., "Vacuum thermal switch made of phase transition materials considering thin film and substrate effects," *Journal of Quantitative Spectroscopy & Radiative Transfer*, 158 (2015) pp. 69-77.

Zhang et al., "Water-Based Microchannel and Galinstan-Based Minichannel Cooling Beyond 1 kW/cm$^2$ Heat Flux," *IEEE Transactions on Components, Packaging and Manufacturing Technology*, 5, 6 (Jun. 2015) pp. 762-770.

Zhang et al., "Self-Fueled Biomimetic Liquid Metal Mollusk," *Advanced Materials*, 27 (2015) pp. 2648-2655.

Zhu et al., "An Integrated Liquid Cooling System Based on Galinstan Liquid Metal Droplets," *ACS Applied Material Interfaces*, 8 (2016) pp. 2173-2180.

Sen, Prosenjit et al., "Microscale Liquid-Metal Switches—A Review," *IEEE Transactions on Industrial Electronics*, 56, 4 (2009) pp. 1314-1330.

Jeon, Jinpyo et al., "On-demand magnetic manipulation of liquid metal in microfluidic channels for electrical switching applications," *Lab on a Chip*, 17, 28 (2017) pp. 128-133.

Jeon, Jinpyo et al., "Magnetic liquid metal marble: Wireless manipulation of liquid metal droplet for electrical switching applications," *Transducers*, 2015 18$^{th}$ International Conference on Solid-State Sensors, Actuators and Microsystems (2015) pp. 1834-1837.

* cited by examiner
† cited by third party

ACTIVE THERMAL MANAGEMENT SYSTEM FOR ELECTRONIC DEVICES AND METHOD OF ACHIEVING DEVICE-TO-DEVICE ISOTHERMALIZATION

RELATED APPLICATION

The present patent document claims the benefit of priority under 35 U.S.C. § 119(e) to U.S. Provisional Patent Application No. 62/649,134, filed on Mar. 28, 2018, which is hereby incorporated by reference in its entirety.

FEDERALLY SPONSORED RESEARCH OR DEVELOPMENT

This invention was made with government support under grant number 1449548 awarded by the National Science Foundation. The government has certain rights in the invention.

TECHNICAL FIELD

The invention is related generally to thermal management of electronic devices and more particularly to an approach for active thermal management in high power density electronic systems.

BACKGROUND

Power electronics having increased volumetric and gravimetric power density are required for various applications, such as mobile systems in all-electric or plug-in hybrid electric vehicles. The utilization of wide-bandgap semiconductor materials such as silicon carbide (SiC) and gallium nitride (GaN) with higher carrier mobility and maximum junction temperature capability are key enablers for realizing dense electronics packaging and increasing the power processing capability. However, the compact layout to reduce the volume and weight of the system and the high level of integration with passive components creates electrothermal obstacles for realizing the full potential of wide bandgap devices. Electronic devices operating with variable losses can generate spatially and temporally varying hot spots, which cannot be mitigated with traditional thermal management approaches.

Thermal management approaches with good cooling performance, such as spray cooling, jet impingement, two phase cooling, heat spreaders (e.g., cold plates), or phase change materials, can remove the heat from hot spots efficiently. Heat spreaders, which are solid structures through which heat flows by thermal conduction, may be effective at providing a path for heat removal from heat-generating electronics to a heat sink or other heat removal element. Yet, these conventional methods can be stymied by the temperature variation between multiple electronic devices on the same module. Previous research has shown that over-temperature and thermal-cycling induced failures are the most common failure modes for power electronic modules. The thermomechanical stresses in the power module can damage the interfaces and connections between semiconductor components, which can reduce reliability due to thermomechanical failures.

BRIEF SUMMARY

An active thermal management system for electronic devices comprises: a heat spreader having an internal channel; a thermally conductive body moveably positioned in the internal channel; and two or more electronic devices in thermal contact with a back surface of the heat spreader and positioned adjacent to the internal channel. A location of the thermally conductive body within the internal channel determines a path for heat flow from the back surface to a front surface of the heat spreader. The location of the thermally conductive body within the internal channel may be selected to minimize a temperature differential ($\Delta T$) between the two or more electronic devices.

A method of achieving device-to-device isothermalization in electronic systems comprises: providing a heat spreader comprising an internal channel and a thermally conductive body moveably positioned in the internal channel; placing a back surface of the heat spreader in thermal contact with two or more electronic devices such that the electronic devices are positioned adjacent to the internal channel; supplying power to the electronic devices, the electronic devices generating heat; and positioning the thermally conductive body within the internal channel so as to minimize a temperature differential ($\Delta T$) between the electronic devices. A location of the thermally conductive body within the internal channel determines a path for heat flow from the back surface to a front surface of the heat spreader.

DETAILED DESCRIPTION

An active thermal management approach for high power density electronics and other electronic systems has been developed. The new approach, which exploits the controllable motion of a thermally conductive body within a hollow heat spreader, may improve the reliability of electronic systems by reducing temperature inhomogeneities and associated thermomechanical stresses.

Figure 1:
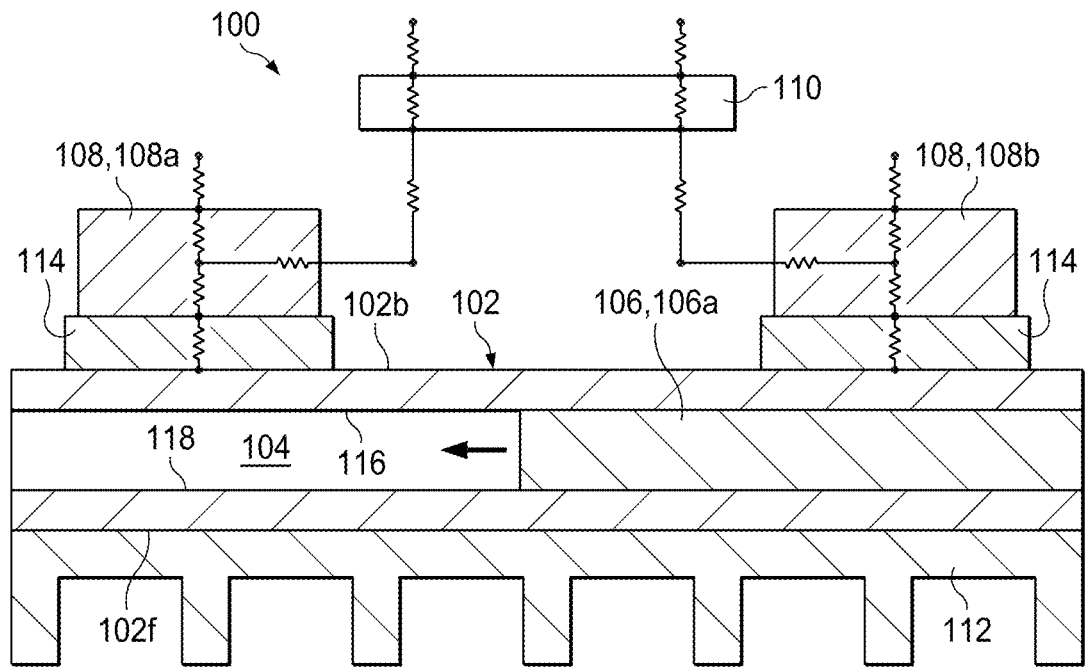
FIG. 1 is a cross-sectional schematic of an exemplary active thermal management system comprising a switchable heat spreader that includes an internal channel with a solid-phase thermally conductive body moveably positioned therein.
Figure 2:
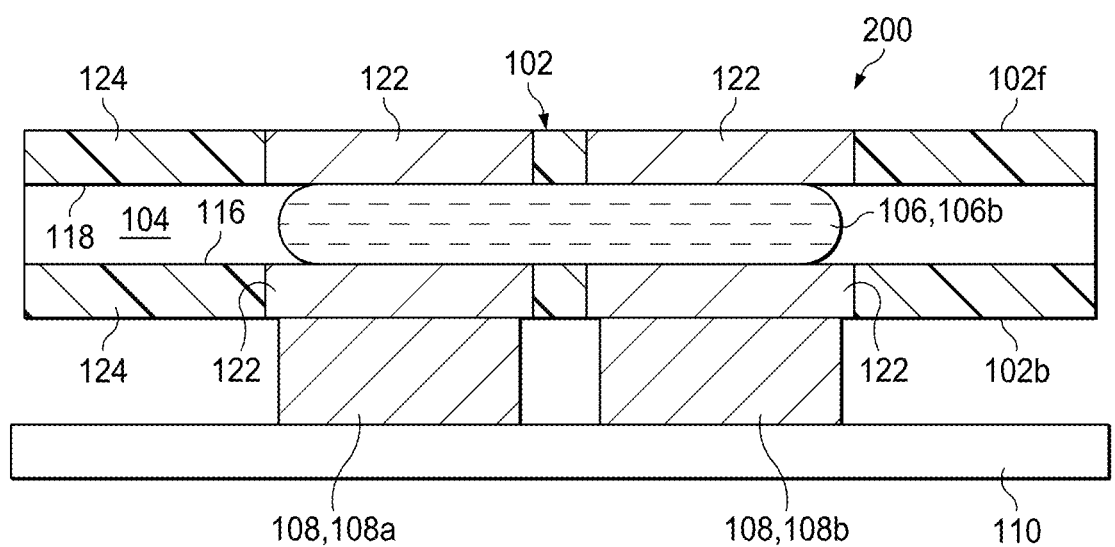
FIG. 2 is a cross-sectional schematic of an exemplary active thermal management system comprising a switchable heat spreader that includes an internal channel with a liquid-phase thermally conductive body moveably positioned therein.

FIG. 1 is a cross-sectional schematic of an exemplary active thermal management system 100. The system 100 comprises a heat spreader 102 having an internal channel 104 with a thermally conductive body 106 moveably positioned in the internal channel 104. The thermally conductive body 106 may be a solid-phase body, as shown in FIG. 1, or liquid-phase body, as shown in FIG. 2 and discussed further below. Two or more electronic devices 108 are in thermal contact with a back surface 102b of the heat spreader 102. The electronic devices 108 are positioned over the internal channel; more specifically, in this example, the exemplary electronic devices 108 shown in FIG. 1 are positioned over opposing ends of the internal channel 104. A path for heat flow from the back surface 102b to a front surface 102f of the heat spreader 102 can be controlled by altering a location of the thermally conductive body 106 within the internal channel 104. Thus, the heat spreader 102 may function as a switchable heat spreader, or "switch spreader," that is "on" or "off" to dissipate concentrated heat depending on the location of the thermally conductive body 106 within the internal channel 104. The front surface 102f of the heat spreader 102 may further be actively and/or passively cooled, as further discussed below.

It should be noted that, in the schematic of FIG. 1, the electronic devices are positioned over opposing ends of the internal channel 104 as a consequence of the orientation of the thermal management system 100 on the page. If the entire system 100 is flipped 180 degrees with no change in the relative position of the components, such that the heat spreader 102 lies above the electronic devices 108, then the electronic devices 108 could alternatively be described as being positioned under the internal channel 104, or under opposing ends of the internal channel 104. FIG. 2 provides a schematic of a thermal management system 200 having such an orientation. Accordingly, independent of the orientation of the thermal management system 100,200, the electronic devices 108 of FIGS. 1 and 2 may be described as being positioned adjacent to the internal channel 104, and in some cases (as in the example of FIG. 1) adjacent to opposing ends of the internal channel 104.

It should also be noted that the electronic devices 108, which are in thermal contact with the back surface 102b of the heat spreader 102, may alternatively be described as being on the back surface 102b of the heat spreader 102. Whether described as being "in thermal contact with" or "on" the back surface 102b, each electronic device 108 may be understood to be either (a) in direct physical contact with the back surface 102b or (b) in contact with the back surface 102b via one or more intervening components or layers through which heat can be transferred (e.g., the gap pads 114 shown in FIG. 1).

When the electronic devices 108 are powered, they may generate a substantial amount of heat through power losses. Given the positioning of the electronic devices 108 on the back surface 102b of the heat spreader 102, adjacent to the internal channel 104, the movement of the thermally conductive body 106 within the internal channel 104 may allow heat dissipation to occur selectively from one or both of the electronic devices 108. For example, referring again to FIG. 1, if the left-hand-side (LHS) device 108a has a higher power loss than the opposing right-hand-side (RHS) device 108b, then the thermally conductive body 106 may be placed at a location in the internal channel 104 effective for preferentially dissipating heat from the LHS device 108a. If, on the other hand, the RHS device 108b has a higher power loss than the LHS device 108a, then the thermally conductive body 106 may be placed at a location effective for preferentially removing heat from the RHS device 108b, as illustrated. The heat spreader 102 may be effective at achieving device-to-device isothermalization, that is, at minimizing a temperature differential ($\Delta T$) between the electronic devices 108. Homogeneous temperature distributions are sought after for high power density electronic systems to improve performance and reliability. Non-isothermal operation of multiple electronic devices on a printed circuit board or power module can lead to thermomechanical stress buildup, which can in turn affect the reliability of interfaces and connections between the devices. Isothermalization reduces the heat concentration on any one electronic device, spreading the heat from the hotter device(s) to a cooler device(s), and enabling more efficient utilization of the thermal management system. Due to the potentially detrimental impact of temperature nonuniformities on system reliability, there is a desire to reduce the $\Delta T$ between devices, even at the expense of a moderately higher maximum device temperature ($T_{max}$).

Figure 3:
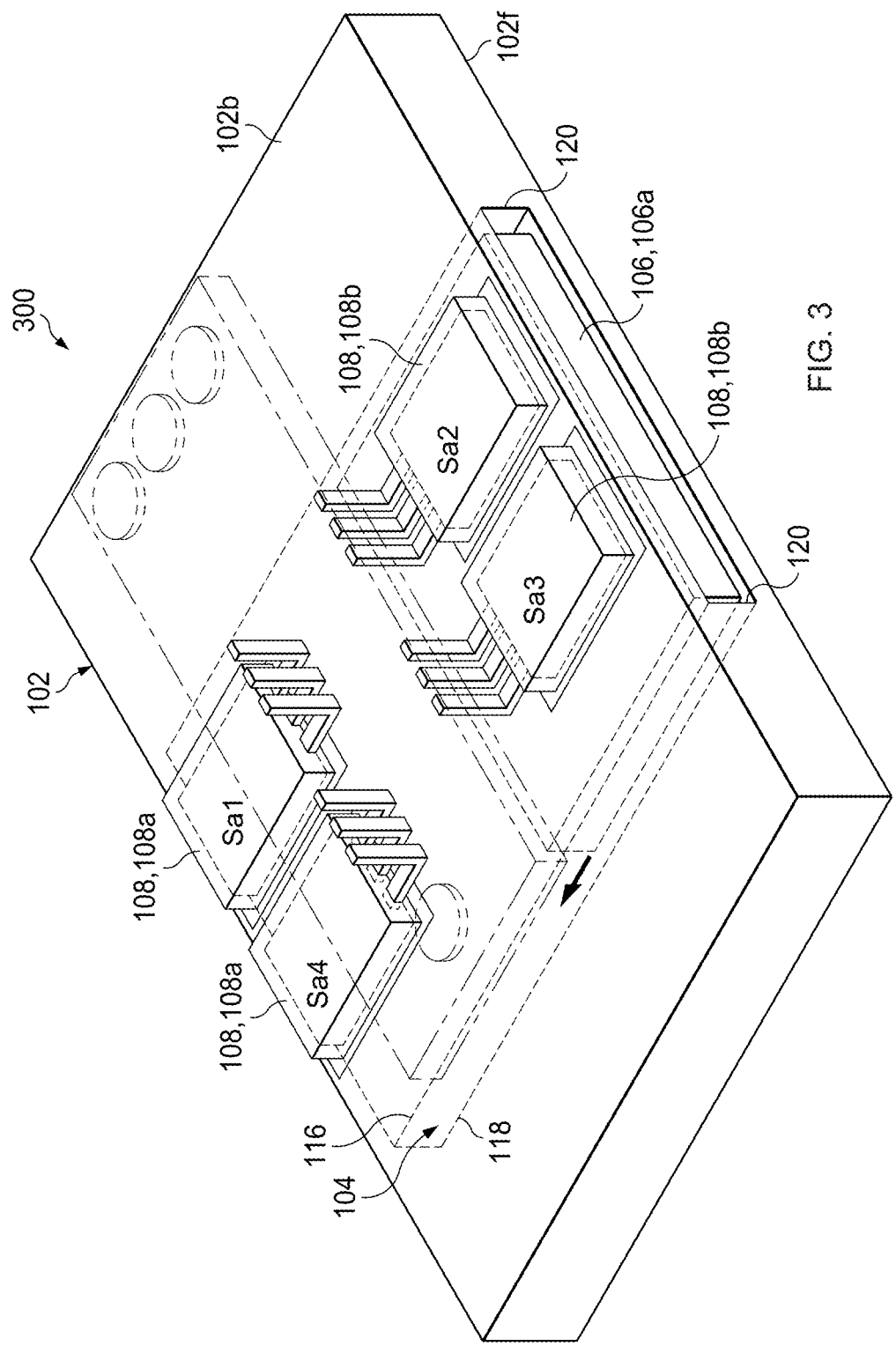
FIG. 3 is a perspective view of the active thermal management system shown in FIG. 1 and employed for finite element simulations.

The heat spreader 102 may comprise a back wall 116, a front wall 118 and side walls 120 enclosing the internal channel 104, as illustrated for example in FIG. 3. Advantageously, the thermally conductive body 106 is in thermal contact with the back wall 116 and the front wall 118 of the internal channel 104, thereby defining a continuous path for heat flow from the back surface 102b to the front surface 102f of the heat spreader 102. The thermally conductive body 106 may also be in thermal contact with the side walls 120 of the internal channel 104. As above, "in thermal contact with" means either in direct physical contact with or in contact with via one or more intervening components or layers through which heat can be transferred.

The heat spreader 102 may comprise a thermally conductive material such as copper, aluminum, brass, stainless steel, alumina, aluminum nitride, and/or boron nitride. For some applications the heat spreader 102 may be formed of a composite that includes the thermally conductive material in conjunction with a less thermally conductive material, such as a polymer. This is illustrated in FIG. 2, where the exemplary heat spreader 102 is fabricated from a silicone polymer 124 in conjunction with thermally conductive metal contacts 122.

The active thermal management system 100 may further include a heat sink 112 attached to a front surface 102f of the heat spreader 102, as illustrated in FIG. 1. Alternatively, a heat sink may be integrally formed with the heat spreader 102; in this case, the front surface 102f of the heat spreader 102 may be a nonplanar surface comprising fins, channels or other features for enhanced surface area. In addition to such passive cooling approaches, the front surface of the heat spreader or the heat sink attached thereto may be actively cooled (e.g., by forced convection) to promote heat dissipation.

The thermally conductive body 106 moveably positioned in the internal channel 104 of the heat spreader 102 may have a thermal conductivity k that is at least about 8 $W \cdot m^{-1} \cdot K^{-1}$, at least about 15 $W \cdot m^{-1} \cdot K^{-1}$, or at least about 50 $W \cdot m^{-1} \cdot K^{-1}$. The thermally conductive body 106 may include one or more metals selected from the group consisting of copper, silver, gold, aluminum, iron, magnesium, zinc, gallium, indium, tin and mercury. As illustrated in FIG. 1, the thermally conductive body 106 may comprise a solid-phase body 106a capable of being moved (e.g., by sliding) along the length of the internal channel. Alternatively, as shown in FIG. 2, the thermally conductive body 106 may comprise a liquid-phase body or droplet 106b capable of being moved (e.g., by sliding and/or rolling) along the length of the internal channel 104. In one example, the liquid-phase droplet 106b may comprise a liquid metal such as mercury, gallium or a gallium alloy (e.g., Ga—In—Sn, or Galinstan®). Typically, the solid-phase body 106a comprises a (solid) metal such as copper, aluminum, silver, gold, iron, magnesium and/or zinc. The liquid-phase droplet 106b may be used more effectively in smaller-scale channels (e.g., 0.1 mm to 10 mm), while the solid-phase body 106a may be more suitable for larger-scale channels (e.g., 10 mm to 200 mm). For ease of use, the internal channel 104 may be substantially straight such that the motion of the thermally conductive body 106 is linear motion. However, for some device arrangements, nonlinear internal channels 104 and nonlinear motion of the thermally conductive body 106 may be preferred.

The portion of the internal channel 104 that does not include the thermally conductive body 106 may comprise a gas or a liquid having a lower thermal conductivity than the thermally conductive body 106. Suitable gases may include air, an inert gas such as argon or helium, nitrogen, or an electrolyte vapor. The gas may be at atmospheric or a lower pressure (e.g., vacuum). Suitable liquids may include an electrolyte solution or water. An internal channel 104 that includes a gas in addition to the thermally conductive body 106 may be referred to as a dry channel, while an internal channel 104 that includes a liquid in addition to the thermally conductive body 106 may be referred to as a wet channel.

It is also contemplated that the gas or liquid in the internal channel 104 may have a higher thermal conductivity than the thermally conductive body 106, such that body 106 may be positioned to impede the flow of heat. In this case, the thermally conductive body 106 may be a solid-phase body 106a or a liquid-phase droplet 106b comprising a material that is less thermally conductive than the gas or liquid in the internal channel 104.

To ensure space for the desired motion, the thermally conductive body 106 extends along only a portion of the length of the internal channel 104. For example, the thermally conductive body 106 may have a length from about 5% to about 75% of a total length of the internal channel or, more typically, from about 20% to about 60% of the total length of the internal channel. Referring again to FIG. 1, the length of the thermally conductive body 106 may be greater than a distance between the electronic devices 108 to ensure the option of having simultaneous heat dissipation from both devices 108.

To reduce friction and potentially enhance the thermal contact, a lubricant may be incorporated between the thermally conductive body 106 and the walls (e.g., back and front walls 116,118) of the internal channel 104. The optional lubricant may be a dry lubricant such as graphite or a wet lubricant such as oil. The thermally conductive body 106 may be movable within the internal channel 104 manually and/or automatically, e.g., as part of an open-loop or closed-loop control process, as illustrated in FIG. 4.

Figure 4:
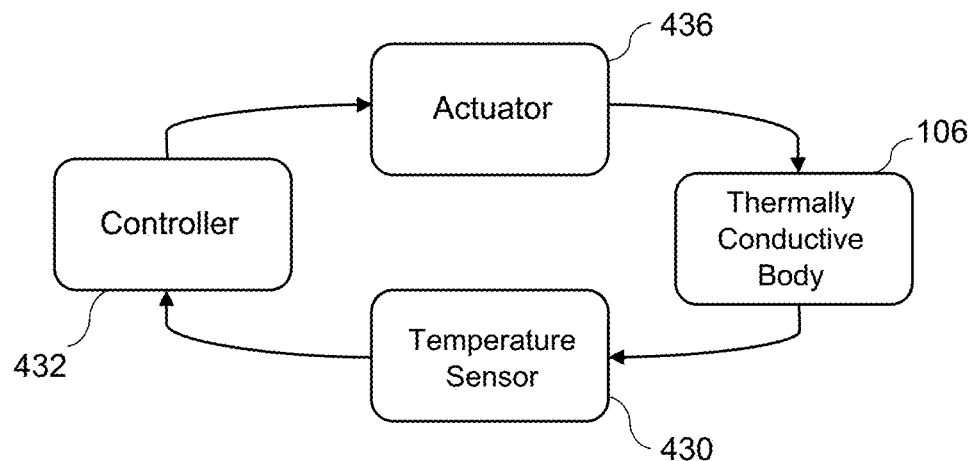
FIG. 4 illustrates a closed-loop control process to alter the position of the thermally conductive body in the internal channel of the switchable heat spreader.

Referring to FIG. 4, the motion of the thermally conductive body 106 may be effected by an actuator 436, such as a hydraulic actuator, a pneumatic actuator, an electric actuator, a magnetic actuator, or a mechanical actuator. For example, a mechanical screw mechanism may be used for actuation. The thermally conductive body 106 may have the form factor of a screw or may be attached to a screw that could be turned by an actuator to induce motion within the channel. In another example, a linear actuator comprising a ball-screw mechanism may be employed to move the thermally conductive body 106, which may have the form factor of a rectangular block, as in FIGS. 1 and 3.

As would be recognized by the skilled artisan, the thermally conductive body 106 can have any desired form factor (shape), ranging from a droplet in the case of a liquid-phase body to any three-dimensional shape for a solid-phase body. The form factor of the thermally conductive body 106 may be determined by the shape of the internal channel 104. For example, for an internal channel 104 having a rectangular cross-section, as shown in FIG. 3, the thermally conductive body 106 may have a rectangular parallelepiped shape. For an internal channel 104 having a circular cross-section, the thermally conductive body 106 may have a cylindrical shape.

As discussed above with respect to FIGS. 1 and 2, the movement of the thermally conductive body 106 within the internal channel 104 may allow heat dissipation to occur selectively from one or both of the electronic devices 108. Accordingly, the thermal management system 400 may further include a temperature sensor 430 for each electronic device 108 and a controller 432 electrically connected to the actuator 434. In use, output from the temperature sensors 430 may be provided to the controller 432 to determine the actuation of the thermally conductive body 106, thereby allowing for repositioning in response to temperature changes. Due to the importance of temperature homogeneity as discussed above, the repositioning may be made to minimize the $\Delta T$ between devices 108.

The electronic devices 108 typically comprise a wide-bandgap semiconductor (e.g., having a bandgap greater than 1.5 eV, and typically in a range from about 2 eV to about 6 eV), such as GaN, SiC, AlN, diamond, or BN. Wide-bandgap semiconductors may enable device operation at higher voltages, frequencies and/or temperatures than conventional semiconductors such as silicon and GaAs. Given that the electronic devices 108 and the heat spreader 102 may be mechanically rigid, a resilient gap pad 114 (shown in FIG. 1) may be disposed between each of the electronic devices 108 and the heat spreader 102 in order to enhance thermal contact and mechanical integrity.

The electronic devices 108 may be mounted on a printed circuit board or power module 110 that includes a number of densely packed devices 108. Accordingly, the active thermal management system 100 may include a plurality of electronic devices 108 (e.g., n electronic devices 108, where n is a positive integer from 2 to 5000) in thermal contact with the back surface 102b of the heat spreader 102. The internal channel 106 may be sufficiently wide such that multiple electronic devices 108 may be positioned over opposing ends of the internal channel 106, as illustrated in the active thermal management system 300 of FIG. 3. If, as explained above, the LHS devices 108a have a higher power loss than the opposing right-hand-side (RHS) devices 108b, then the thermally conductive body 106 may be placed at a location in the internal channel 104 effective for preferentially dissipating heat from the LHS devices 108a. If, on the other hand, the RHS devices 108b have a higher power loss than the LHS devices 108a, then the thermally conductive body 106 may be placed at a location effective for preferentially removing heat from the RHS devices 108b, as shown.

As in FIG. 1, the electronic devices 108 of FIG. 3 are positioned over the internal channel 104, more specifically over opposing ends of the internal channel 104, given the orientation of the system 100 in this schematic, where the heat spreader 102 is underneath the electronic devices 108. If the entire system 100 is flipped 180 degrees with no change in the relative position of the components, as described above, then the electronic devices 108 of FIG. 3 could alternatively be described as being positioned under the internal channel 104, or under opposing ends of the internal channel 104. In either case, the relative positioning of the electronic devices 108 and the internal channel 108 is the same. Accordingly, the electronic devices 108 may alternatively be described as being positioned adjacent to the internal channel 104, or adjacent to opposing ends of the internal channel 104, on the back surface 102b of the heat spreader 102.

When more than two electronic devices 108 are positioned adjacent to the internal channel 104, as shown for example in FIG. 3, it is understood that the phrase "between the electronic devices" refers to a pair of electronic devices disposed adjacent to each other along the line of motion of the thermally conductive body. Electronic devices having this relationship may alternatively be described as being "opposing devices." Thus, movement of the thermally conductive body within the internal channel "between the electronic devices" may refer to movement between the opposing devices labeled Sa4 and Sa3 and/or to movement between the opposing devices labeled Sa1 and Sa2. Similarly, a temperature differential "between the electronic devices" may refer to the ΔT between the opposing devices labeled Sa4 and Sa3 and/or to the ΔT between the opposing devices labeled Sa1 and Sa2.

A method of actively cooling electronic devices to achieve device-to-device isothermalization for a high power density electronic system is also described and may be understood in reference to FIG. 1, 2 or 3. The method comprises providing a heat spreader 100,200,300 having an internal channel 104 and a thermally conductive body 106 moveably positioned in the internal channel 104. A back surface 102b of the heat spreader 102 is placed in thermal contact with two or more electronic devices 108 such that the electronic devices 108 are adjacent to the internal channel 104 (e.g., adjacent to opposing ends of the internal channel 104). Power is supplied to the electronic devices 108, and the electronic devices 108 generate heat as a consequence of power losses. As described above, homogeneous temperature distributions are sought after for high power density electronic systems to improve performance and reliability. Toward this end, the thermally conductive body 106 is positioned within the internal channel 104—and repositioned as needed—to minimize a temperature differential (ΔT) between the electronic devices 108. The motion of the thermally conductive body 106 within the internal channel 104 alters a path for heat flow from the back surface 102b to a front surface 102f of the heat spreader 102, thereby allowing for controlled heat dissipation from the electronic devices 108. Using this approach, ΔT may be minimized and isothermal or near-isothermal operation may be achieved.

The positioning and repositioning of the thermally conductive body 106 may be actuated as described above and/or carried out as part of an open- or closed-loop control process. The thermally conductive body 106 may comprise a liquid-phase droplet or a solid-phase body having any of the characteristics described in this disclosure. Similarly, the heat spreader 102 and the electronic devices 108, which may be mounted on a printed circuit board or power module 110, may have any of the characteristics set forth above or elsewhere in this disclosure.

For example, as described above, a heat sink 112 may be attached to a front surface 102f of the heat spreader 102, as illustrated in FIG. 1, or the heat spreader 102 may have a nonplanar front surface comprising fins, channels or other features for enhanced surface area, so as to function as a heat sink. Also or alternatively, the method may further include active cooling of the front surface 102f of the heat spreader 102 (or the heat sink 112 attached thereto) to enhance heat dissipation. Such active cooling may comprise forced convection, in one example, where a coolant fluid (gas or liquid) is flowed over the front surface 102f of the heat spreader 102 or heat sink 112.

Experiments and computer simulations with a switchable heat spreader have been carried out to demonstrate the capability of maintaining two independent electronic devices at a constant temperature (device-to-device isothermalization) by controlling the position of a thermally conductive body within the internal channel. The experiments are carried out using a liquid-phase thermally conductive body movably positioned in the internal channel, and the computer simulations are carried out using a solid-phase thermally conductive body movably positioned in the internal channel.

EXAMPLE 1

Switchable Heat Spreader with Liquid Metal Droplet

In a first example, two GaN devices are integrated with a liquid metal-based heat spreader as described below. By precisely controlling the location of the liquid metal droplet in the internal channel, variable thermal pathways to the front side of the heat spreader can be obtained and—at some optimal set point depending on the GaN device temperature mismatch—temperature equilibration. The length of the liquid metal droplet employed for this example is longer than the length of the two GaN devices, which are closely spaced apart, as shown in the schematic of FIG. 2. Thus, the liquid metal droplet may be positioned adjacent to both GaN devices simultaneously.

To fabricate the heat spreader of this example, two top-cooled EPC 2034 GaN devices (Efficient Power Conversion Corporation), each having dimensions of 2.6 mm×4.6 mm×0.7 mm, are soldered onto a single printed circuit board (PCB) having dimensions of 40 mm×40 mm×1.6 mm. The heat spreader includes an internal channel having dimensions of 1 mm×5 mm×30 mm, a liquid metal droplet having dimensions of 1 mm×5 mm×22 mm, and two metal conductors (Shapal Hi-M) having dimensions of 1 mm×5 mm×10 mm. The 1 mm-thick metal conductors are selected to ensure low junction-to-coolant thermal resistance and ease of fabrication. The bottom metal conductor and channel are first integrated onto the electronic devices by solidifying liquid silicone (10:1 mixture of Sylgard 184 silicone elastomer base and Sylgard 184 silicone elastomer curing agent) in a container with the silicone level exposed to the channel top for integration. The 1 mm-thick top metal conductor is placed into a separate container having 1 mm-thick liquid silicone, which represents the top of the heat spreader after silicone solidification. Once solidification is complete, the separate parts are removed from the containers and glued together with the same silicone liquid. After drying, a 1 M/L NaOH aqueous solution and the liquid metal droplet are injected into the internal channel successively by separate syringes (BD 1 ml TB Syringe). To create a dry internal channel, the aqueous solution is subsequently sucked out using a clean syringe. The same silicone liquid is used to seal injection pinholes.

Figure 5:
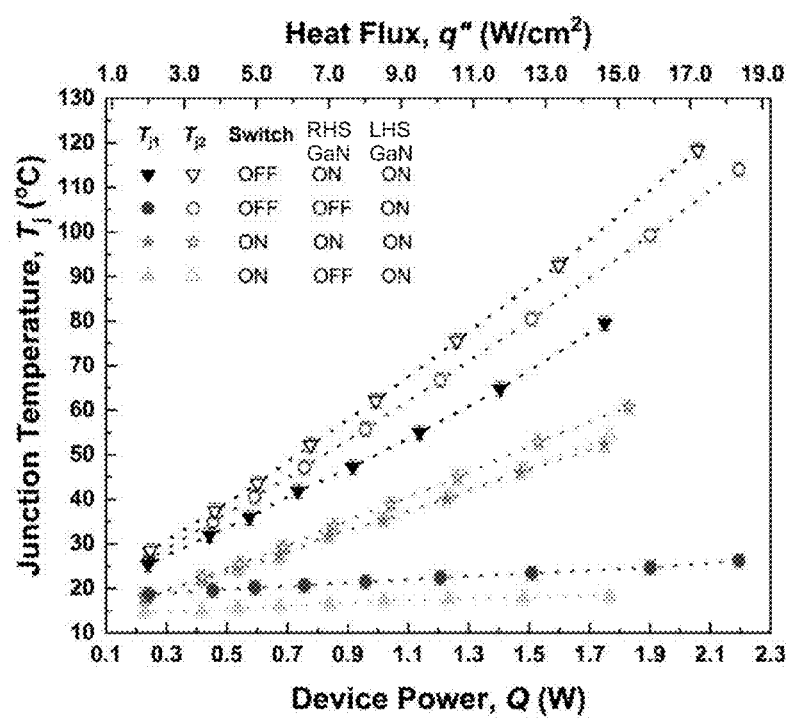
FIG. 5 shows junction temperatures of two electronic devices as a function of device power with the liquid metal droplet position in the internal channel ranging from x=0 (ON) to x=∞ (OFF).

The liquid metal droplet is actuated to move along a wet channel by gravity in the x direction via rotation of the PCB. When the liquid metal droplet residing in the channel overlies (is adjacent to) both GaN devices, as depicted in FIG. 2, the switchable heat spreader is in the ON mode and the droplet location is defined as x=0. When the liquid metal droplet is moved far from the GaN devices (e.g., out of the internal channel), the switchable heat spreader is in the OFF mode and the droplet location is x=∞. FIG. 5 shows the junction temperatures of the two GaN devices as a function of device power with the droplet position ranging from x=0 (ON) to x=∞ (OFF). When the left-hand-side (LHS) GaN device 108a is powered at 0.2 to 2.2 W and the right-hand-side (RHS) GaN device 108b is powered at 0 W, the junction temperature $T_{j2}$, corresponding to the LHS GaN device 108a, is always lower than when both GaN devices are powered at 0.2 to 2.2 W. The concentrated heat flux from the LHS GaN device is reduced due to heat spreading through the liquid metal droplet (switch ON) or the electrolyte (switch OFF) in the channel. The maximum switching speed is observed to be approximately 1 Hz; however, the response time of the switchable heat spreader may be increased utilizing a smaller-scale component than the centimeter-scale component employed in this example.

When both the LHS GaN and the RHS GaN devices are powered at 0.2 to 2.2 W, the LHS GaN device exhibits a higher junction temperature than the RHS GaN device in both the ON and OFF mode. The temperature difference at identical power levels indicates that the electronic device fabrication or soldering processes are not identical. The presence of a non-uniform temperature distribution at the same power level for multiple independent devices is a common occurrence in electronic systems that can potentially lead to elevated thermomechanical stresses and long-term failure. The non-uniform junction temperatures provides a reference to characterize the heat spreader isothermalization performance by moving the liquid metal droplet along the channel to differing positions.

Figure 6:
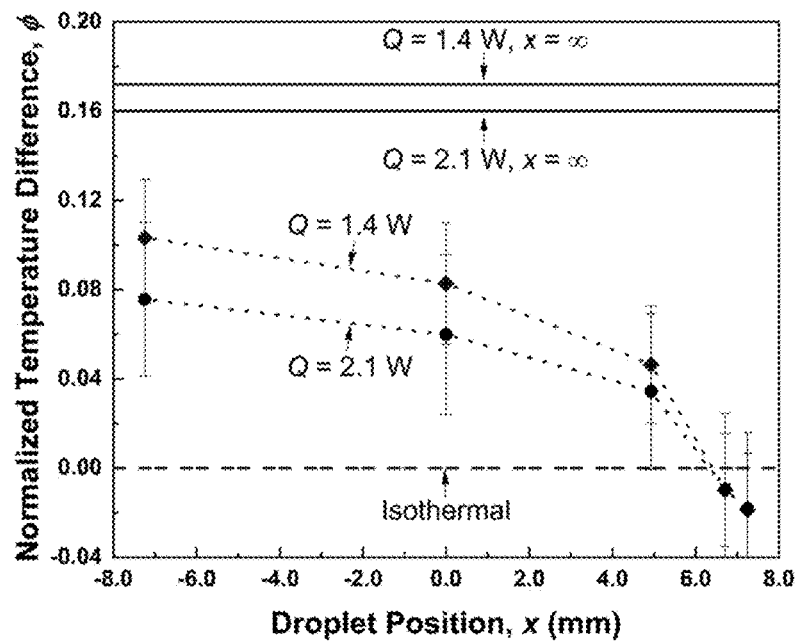
FIG. 6 shows normalized electronic device temperature difference $\phi=2\,(T_{j2}-T_{j1})/(T_{j2}+T_{j1})$ as a function of the liquid metal droplet position (x) in the internal channel at two different device powers (Q).

FIG. 6 shows the isothermalization performance of the switchable heat spreader. The normalized temperature difference between the electronic devices is defined as $\phi=2(T_{j2}-T_{j1})/(T_{j2}+T_{j1})$, and acts as a quantifiable measure of the non-uniformity of the junction temperatures between the RHS and LHS GaN devices as a function of the liquid metal droplet position (x) at two different device powers (Q). Both GaN devices are powered at the same level (Q=1.4 W or Q=2.1 W). When the liquid metal droplet is removed from the electrolyte-filled internal channel or disposed within the internal channel very far from the electronic devices (x=∞), the switchable heat spreader is in the OFF mode. Dotted trend lines between experimental points show the trend of the normalized temperature difference. Solid lines represent experimental data. The errors are estimated by a propagation method from the junction temperature error (±1.6° C.).

Referring to the data of FIG. 6, when the heat spreader is in the OFF mode, the normalized temperature difference $\phi$ is 0.173 and 0.160 with the GaN devices powered at 1.4 W and 2.1 W, respectively. The higher device power enhances the temperature uniformity due to elevated heat spreading through the internal channel. When the liquid metal droplet moves from x=−7.2 mm to x=+7.2 mm, $\phi$ reduces further via efficient heat spreading through the liquid metal droplet. The normalized temperature difference reaches zero ($\phi$=0) at x=6.2 mm, indicating that the RHS GaN and LHS GaN devices are at the same temperature (isothermal operation). This demonstration shows that the switchable heat spreader is capable of dynamically balancing heat transfer and achieving isothermalization of multiple electronic devices by switching the liquid metal droplet to predetermined positions within the internal channel.

EXAMPLE 2

Switchable Heat Spreader with Metal Slider

Finite element simulations using a solid-phase thermally conductive body ("slider") movably positioned in the internal channel are used to predict the temperature distribution within the heat spreader and the effect of slider position on temperature and heat flux.

Referring to FIG. 3, the switchable heat spreader of this example comprises alumina with a movable copper slider in the internal channel. The heat spreader has dimensions of 107 mm×153 mm×10 mm. The internal channel has dimensions of 107 mm×80 mm×8 mm. The slider moving in the channel has a transverse cross-sectional area of 80 mm×8 mm. The slider position and size can be modified as inputs to the simulations. Electronic devices are introduced to the model as concentrated heat sources labeled Sa1, Sa2, Sa3, Sa4, where Sa1 and Sa4 are disposed in opposition to Sa2 and Sa3, respectively, on the heat spreader, adjacent to the internal channel. The system layout can be created in computer aided graphics and then imported into the finite element software, or can be created directly in the finite element software.

The heat transfer boundary conditions are as follows. The heat sink is modeled as a forced-convective boundary by air with an appropriate cooling coefficient. Other boundaries are set as natural convection conditions in air. Within the model domain, only heat conduction is considered, and modeled using Fourier's Law. As the input, the slider length is parametrically swept from 0 to 107 mm to optimize the design. For each step in the parametric sweep, the temperature distribution is acquired as the simulation output. Other geometric parameters can be explored with similar parametric sweeps.

Figure 7:
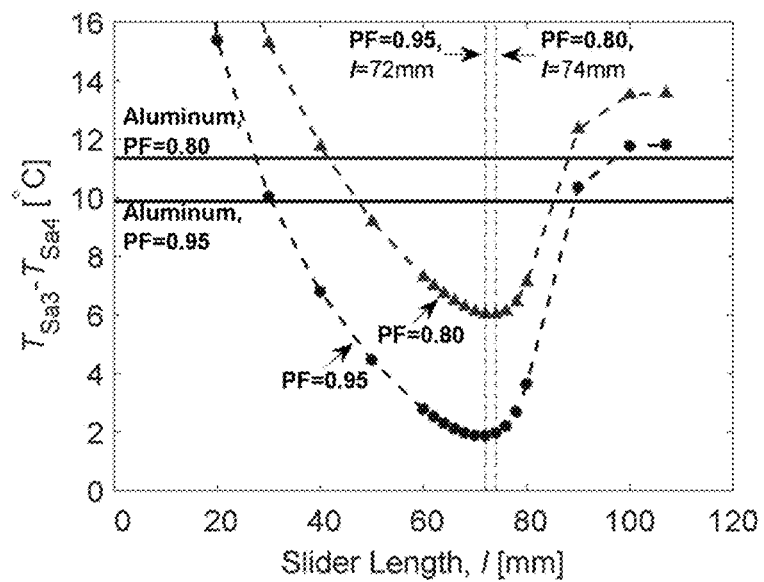
FIG. 7 shows $\Delta T$ as a function of slider length as determined from finite element simulations of the active thermal management system shown in FIG. 3.
Figure 8:
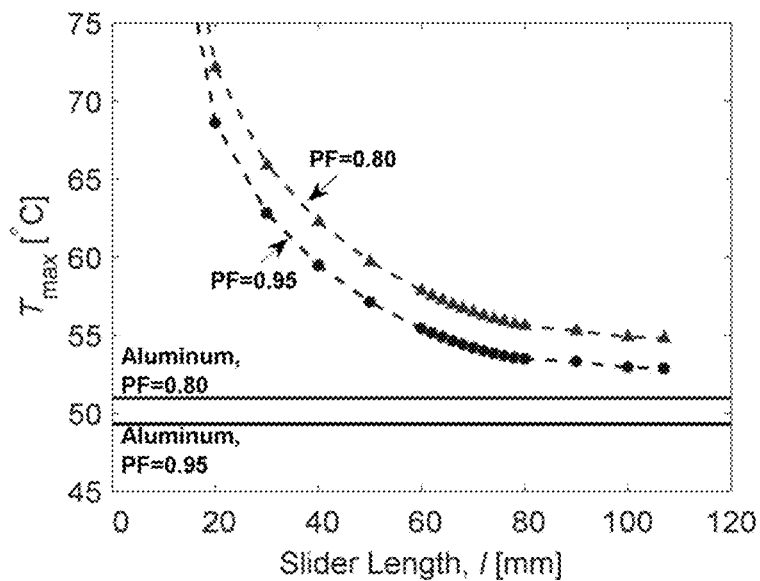
FIG. 8 shows $T_{max}$ as a function of slider length as determined by the finite element simulations.
Figure 9:
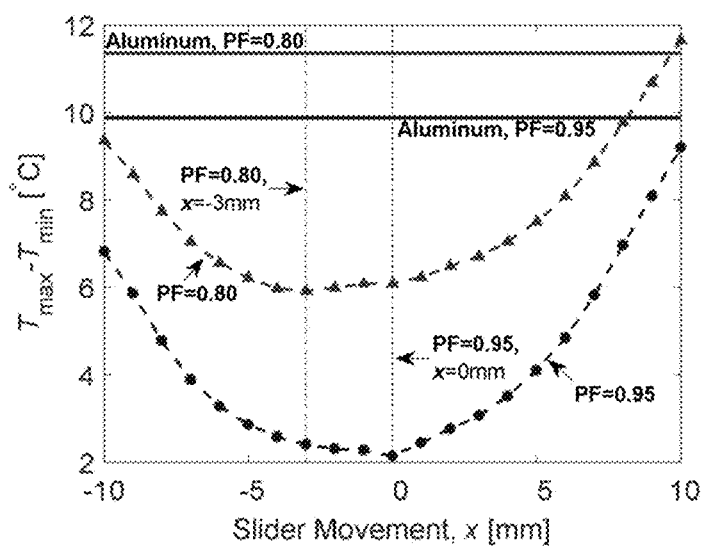
FIG. 9 shows $\Delta T$ as a function of slider motion/position (x) as determined from finite element simulations of three power modules.
Figure 10:
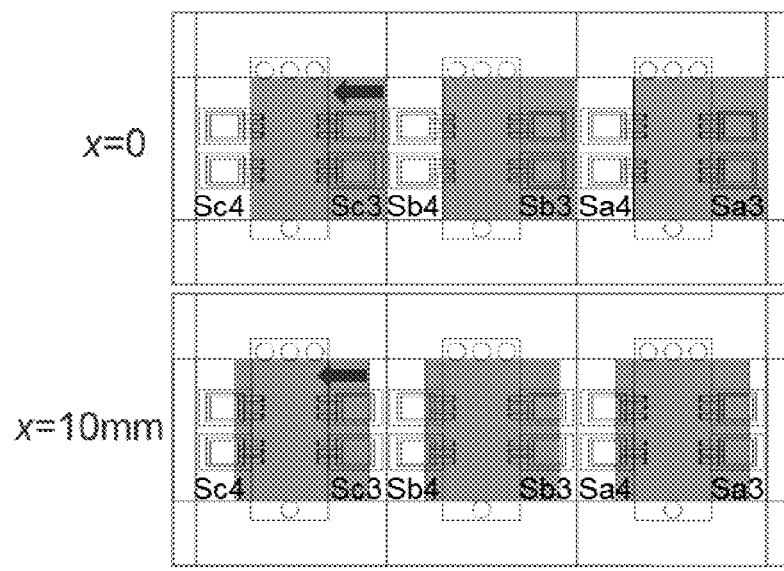
FIG. 10 is a top-view schematic of the three power modules modeled in the finite element simulations, where each power module includes four electronic devices positioned on the back surface of the switchable heat spreader in pairs adjacent to opposing ends of the internal channel.

Based on the predicted temperature distribution, the temperature difference (ΔT) between opposing devices is calculated. In comparison with simulations carried out using a conventional aluminum heat spreader with no internal channel or copper slider, the switchable heat spreader produces a much lower ΔT. The slider length corresponding to the minimum temperature difference, as can be determined from the data of FIG. 7, achieves the optimal heat spreader design. The optimal slider length is found to be different for different power factors, where the power factor (PF) represents the ratio of power dissipated over power available. The solid lines represent baseline data obtained from the conventional heat spreader. FIG. 8 illustrates, in comparison with FIG. 7, the trade-off between ΔT and $T_{max}$. The optimal slider position can be determined from the data in FIG. 9, which shows that the optimal slider position depends on the power factor (e.g., x=0 mm for PF=0.95, and x=−3 mm for PF=0.80). This set of data is based on finite element modeling with multiple modules, each including two pairs of electronic devices positioned in opposition to each other on the back surface of the heat spreader, adjacent to the internal channel. For example, referring to FIG. 10, the first module includes opposing devices Sa1 and Sa2, and opposing devices Sa3 and Sa4; the second module includes opposing devices Sb1 and Sb2, and opposing devices Sb3 and Sb4;

and the third module includes opposing devices Sc1 and Sc2, and opposing devices Sc3 and Sc4.

The switchable heat spreader platform presented here for wide-bandgap devices such as GaN is applicable to other electronic devices, including Si and SiC devices as discussed above, as well as to passive components, such as inductors and capacitors, depending on the PCB or power module layout and design needs. For more complicated applications with irregular heat spikes or thermal cycling, the switchable heat spreader may be used in conjunction with other thermal management methods.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. An active thermal management system for electronic devices, the active thermal management system comprising: a heat spreader comprising an internal channel; a thermally conductive body moveably positioned in the internal channel, the thermally conductive body consisting of a liquid-phase droplet;
and two or more electronic devices in thermal contact with a back surface of the heat spreader and positioned adjacent to the internal channel, wherein the thermally conductive body is movable within the internal channel by an actuator selected from the group consisting of: hydraulic actuator, pneumatic actuator, electric actuator, magnetic actuator, and mechanical actuator, and wherein a location of the thermally conductive body within the internal channel determines a path for heat flow from the back surface to a front surface of the heat spreader, and wherein the liquid-phase droplet comprises one or more metals selected from the group consisting of: Ga, In, Sn, and Hg.

2. The active thermal management system of claim 1, wherein the location of the thermally conductive body within the internal channel is selected to minimize a temperature differential ($\Delta T$) between the electronic devices.

3. The active thermal management system of claim 1, further comprising a temperature sensor for each electronic device and a controller electrically connected to the actuator, wherein, in use, output from the temperature sensors is provided to the controller.

4. The active thermal management system of claim 1, wherein each of the electronic devices comprises a wide bandgap semiconductor having a bandgap in a range from about 2 eV to about 4 eV.

5. The active thermal management system of claim 1, wherein the internal channel further comprises a gas or a liquid having a lower thermal conductivity than the thermally conductive body, whereby heat flow is enhanced at the location of the thermally conductive body.

6. The active thermal management system of claim 1, wherein the internal channel further comprises a gas or a liquid having a higher thermal conductivity than the thermally conductive body, whereby heat flow is impeded at the location of the thermally conductive body.

7. The active thermal management system of claim 1, further comprising a heat sink attached to the front surface of the heat spreader.

8. The active thermal management system of claim 1, wherein a heat sink is integrally formed with the heat spreader, the front surface of the heat spreader being a nonplanar surface comprising fins or channels.

9. The active thermal management system of claim 1, further comprising a lubricant disposed between the thermally conductive body and the internal channel.

10. The active thermal management system of claim 1, wherein the heat spreader comprises a thermally conductive material selected from the group consisting of: copper, aluminum, brass, stainless steel, alumina, aluminum nitride, and boron nitride.

11. The active thermal management system of claim 1, wherein the electronic devices are mounted on a printed circuit board or power module.

12. An active thermal management system for electronic devices, the active thermal management system comprising:
a heat spreader comprising an internal channel;
a thermally conductive body moveably positioned in the internal channel;
a lubricant disposed between the thermally conductive body and the internal channel; and
two or more electronic devices in thermal contact with a back surface of the heat spreader and positioned adjacent to the internal channel,
wherein the thermally conductive body is movable within the internal channel by an actuator selected from the group consisting of: hydraulic actuator, pneumatic actuator, electric actuator, magnetic actuator, and mechanical actuator, and
wherein a location of the thermally conductive body within the internal channel determines a path for heat flow from the back surface to a front surface of the heat spreader.

* * * * *